(12) United States Patent
Bulumulla et al.

(10) Patent No.: US 9,829,550 B2
(45) Date of Patent: Nov. 28, 2017

(54) MULTI-NUCLEAR RECEIVING COILS FOR MAGNETIC RESONANCE IMAGING (MRI)

(71) Applicant: General Electric Company, Schenectady, NY (US)

(72) Inventors: Selaka Bandara Bulumulla, Niskayuna, NY (US); Joseph Alfred Iannotti, Niskayuna, NY (US); Eric William Fiveland, Niskayuna, NY (US); Fraser Robb, Aurora, OH (US)

(73) Assignee: General Electric Company, Niskayuna, NY (US)

( * ) Notice: Subject to any disclaimer, the term of this patent is extended or adjusted under 35 U.S.C. 154(b) by 1179 days.

(21) Appl. No.: 13/728,874

(22) Filed: Dec. 27, 2012

(65) Prior Publication Data

US 2014/0184217 A1    Jul. 3, 2014

(51) Int. Cl.
*G01R 33/36*    (2006.01)
(52) U.S. Cl.
CPC ............................... *G01R 33/3635* (2013.01)
(58) Field of Classification Search
CPC .................................................. G01R 33/3635
See application file for complete search history.

(56) References Cited

U.S. PATENT DOCUMENTS

| | | | |
|---|---|---|---|
| 4,129,822 A * | 12/1978 | Traficante | G01R 33/3628 324/322 |
| 4,792,759 A | 12/1988 | Keren et al. | |
| 4,799,016 A | 1/1989 | Rezvani | |
| 4,951,009 A * | 8/1990 | Collins | G01R 33/3628 333/17.3 |
| 5,365,173 A * | 11/1994 | Zou | G01R 33/34 324/318 |
| 5,861,748 A * | 1/1999 | Schaefer | G01R 33/3635 324/318 |
| 6,081,120 A * | 6/2000 | Shen | G01R 33/3635 324/318 |
| 6,229,310 B1 * | 5/2001 | Green | G01R 33/34061 324/318 |
| 6,400,154 B2 | 6/2002 | Tomanek et al. | |

(Continued)

OTHER PUBLICATIONS

Bolo, Nicolas R. et al., Brain Pharmacokinetics and Tissue Distribution In Vivo of Fluvoxamine and Fluoxetine by Fluorine Magnetic Resonance Spectroscopy, Elsevire, Mar. 16, 2000, pp. 1-11, vol. 23, No. 4, Published by Elsevier Science Inc., 655 Avenue of the Americas, New York, NY 10010 USA.

(Continued)

*Primary Examiner* — Dixomara Vargas
(74) *Attorney, Agent, or Firm* — Pabitra K. Chakrabarti (57) ABSTRACT

A system includes a multi-nuclear magnetic resonance (MR) receiving coil, wherein the receiving coil includes a frequency tuning component configured operate the receiving coil at either a first frequency or a second frequency. The receiving coil also includes an impedance matching component configured to maintain a substantially constant impedance of the receiving coil when the receiving coil is operated at either the first frequency or the second frequency. Furthermore, the receiving coil is configured to measure a first nucleus when operated at the first frequency, and wherein the receiving coil is configured to measure a second nucleus when operated at the second frequency.

30 Claims, 8 Drawing Sheets

(56) References Cited

U.S. PATENT DOCUMENTS

| | | | |
|---|---|---|---|
| 6,710,597 B2 | 3/2004 | Reykowski et al. | |
| 7,119,541 B2* | 10/2006 | Barberi | G01R 33/3635 324/318 |
| 7,123,012 B2* | 10/2006 | Srinivasan | G01R 33/34046 324/318 |
| 7,511,500 B2* | 3/2009 | Schiano | G01R 33/341 324/318 |
| 7,605,466 B2 | 10/2009 | Aimi et al. | |
| 7,609,136 B2 | 10/2009 | Wang et al. | |
| 7,692,519 B2 | 4/2010 | Premerlani et al. | |
| 7,714,581 B2* | 5/2010 | Erickson | G01R 33/345 324/318 |
| 7,733,092 B2* | 6/2010 | Otake | G01R 33/34046 324/318 |
| 7,782,059 B2* | 8/2010 | DeVries | G01R 33/3403 324/318 |
| 7,816,918 B2* | 10/2010 | Bottomley | G01R 33/3415 324/318 |
| 7,928,333 B2 | 4/2011 | Wang et al. | |
| 8,030,932 B2* | 10/2011 | DeVries | G01R 33/3403 324/318 |
| 8,054,147 B2 | 11/2011 | Hays et al. | |
| 8,170,643 B2* | 5/2012 | Turner | A61N 5/02 600/411 |
| 8,193,811 B2* | 6/2012 | Tropp | G01R 33/3415 324/318 |
| 8,207,735 B2* | 6/2012 | Clark | G01R 33/343 324/318 |
| 8,217,653 B2* | 7/2012 | Vaughan | G01R 33/3415 324/307 |
| 8,638,093 B2* | 1/2014 | Aimi | G01R 33/3657 324/300 |
| 8,981,774 B2* | 3/2015 | Leussler | G01R 33/3628 324/307 |
| 2009/0159409 A1 | 6/2009 | Keimel et al. | |

OTHER PUBLICATIONS

Hancu, I. et al., Simple 19F /1H coil, 2010, p. 1, Abstract.

Ha, Seunghoon, A PIN Diode Controlled Dual-Tuned MRI RF Coil and Phased Array for Multi Nuclear Imaging, Apr. 14, 2010, pp. 2589-2600, IOP Publishing.

* cited by examiner

FIG. 10

MULTI-NUCLEAR RECEIVING COILS FOR MAGNETIC RESONANCE IMAGING (MRI)

BACKGROUND

The subject matter disclosed herein relates to magnetic resonance imaging (MRI) for industrial or medical applications.

In MRI systems, a highly uniform, static magnetic field is produced by a primary magnet to align the spins of gyromagnetic nuclei within a subject of interest. The nuclear spins are perturbed by a radiofrequency (RF) transmit pulse, encoded based on their position using gradient coils, and allowed to equilibrate. During equilibration, faint RF fields are emitted by the spinning, processing nuclei and are detected by a series of RF receiving coils. The signals resulting from the detection of the RF fields are then processed to reconstruct a useful image.

Hydrogen ($^1$H) is a gyromagnetic nucleus often observed using MRI. For example, an MRI may be used to analyze and distinguish hydrogen in different local environments within the subject of interest (e.g., hydrogen in water, hydrogen in fats, and so forth). Other gyromagnetic nuclei (e.g., $^{13}$C, $^{19}$F, $^{23}$Na, etc.) may also be measured using MRI. However, in order to image more than one type of gyromagnetic nucleus in the subject of interest (e.g., $^1$H and $^{13}$C), a different set of RF receiving coils is typically used for each nucleus of interest. Further, removing and replacing the RF receiving coils often entails re-alignment of the coil to the imaging region, consuming technician time while increasing machine downtime.

BRIEF DESCRIPTION

In one embodiment, a system includes a multi-nuclear magnetic resonance (MR) receiving coil, wherein the receiving coil includes a frequency tuning component configured operate the receiving coil at either a first frequency or a second frequency. The receiving coil also includes an impedance matching component configured to maintain a substantially constant impedance of the receiving coil when the receiving coil is operated at either the first frequency or the second frequency. Furthermore, the receiving coil is configured to measure a first nucleus when operated at the first frequency, and wherein the receiving coil is configured to measure a second nucleus when operated at the second frequency.

In another embodiment, a multi-nuclear magnetic resonance imaging (MRI) system includes an array of magnetic resonance (MR) receiving coils. Each of the receiving coils include a frequency tuning component configured to set the receiving coil to a first frequency to observe a first nucleus and to set the receiving coil to a second frequency to observe a second nucleus. Furthermore, each of the receiving coils includes an impedance matching component configured to match an impedance of the receiving coil at the second frequency to an impedance of the receiving coil at the first frequency. The MRI system also includes a receiver coupled to the array of receiving coils via one of a plurality of receiver chains.

In another embodiment, a method includes operating a multi-nuclear magnetic resonance (MR) receiving coil at a first frequency, wherein operating the receiving coil at the first frequency corresponds to a particular impedance. The method also includes switching a first switch of the receiving coil to change the frequency of the receiving coil from the first frequency to a second frequency. The method further includes switching a second switch of the receiving coil to alter a capacitance of the receiving coil and switching a third switch of the receiving coil to alter an inductance of the receiving coil. Furthermore, switching the second and third switches substantially maintains the particular impedance of the receiving coil at the second frequency. In certain embodiments, these switches may be switched simultaneously such that the resonance frequency of the coil may be achieved when the inductance of the coil is cancelled out by the total of the capacitance in the frequency matching and impedance matching circuits after switching. Further, in certain embodiments, impedance matching circuit may transform the coil impedance to approximately 50 ohms, for example, to match to the impedance of transmission cable.

BRIEF DESCRIPTION OF THE DRAWINGS

These and other features, aspects, and advantages of the present invention will become better understood when the following detailed description is read with reference to the accompanying drawings in which like characters represent like parts throughout the drawings, wherein.

DETAILED DESCRIPTION

One or more specific embodiments of the present disclosure will be described below. In an effort to provide a concise description of these embodiments, all features of an actual implementation may not be described in the specification. It should be appreciated that in the development of any such actual implementation, as in any engineering or design project, numerous implementation-specific decisions must be made to achieve the developers' specific goals, such as compliance with system-related and business-related constraints, which may vary from one implementation to another. Moreover, it should be appreciated that such a development effort might be complex and time consuming, but would nevertheless be a routine undertaking of design, fabrication, and manufacture for those of ordinary skill having the benefit of this disclosure.

When introducing elements of various embodiments of the present disclosure, the articles "a," "an," "the," and "said" are intended to mean that there are one or more of the elements. The terms "comprising," "including," and "having" are intended to be inclusive and mean that there may be additional elements other than the listed elements.

As set forth above, it may be desirable to image more than one type of gyromagnetic nucleus (e.g., $^1$H and $^{13}$C) in the subject of interest during an MRI. Furthermore, it may be desirable to use tunable receiving coils to analyze multiple gyromagnetic nuclei in the subject of interest. It should be appreciated that by utilizing multi-nuclear, tunable receiving coils, a MRI system may acquire data from either nucleus without waiting for a technician to remove and replace the receiving coils. As such, using the presently disclosed multi-nuclear receiving coil may generally obviate the careful image registration used to piece together data collected from measurements of different nuclei when different receiving coils are used. Furthermore, using multi-nuclear, tunable receiving coils enables a measure of either nucleus in rapid succession, enabling imaging of more than one nucleus for time-sensitive imaging applications (e.g., metabolic studies), for which swapping the receiving coils may be impractical.

One example of a tunable receiving coil includes a separate loop that, when energized, can couple to the receiving coil and split the initial resonance frequency (e.g., the resonance frequency of $^{19}$F at approximately 120 MHz at 3 tesla (T)) such that a second nucleus may be measured (e.g., $^1$H at approximately 128 MHz). However, using a loop to split the resonance peak of the coil may be limited to tuning the coil over a relatively narrow range of frequencies. For example, the example described above may be effective for constructing a receiving coil that may be tuned to measure $^{19}$F at approximately 120 MHz (e.g., at a field strength of 3 T) and to measure $^1$H at approximately 128 MHz since the difference is only approximately 8 MHz. For nuclei having greater difference between the resonance frequencies (e.g., $^1$H at approximately 128 MHz and $^{13}$C at approximately 32 MHz at 3 T), using a separate coil, as described above, may not provide the desired frequency range for the tunable receiving coil.

As such, embodiments of tunable receiving coils are presently disclosed that are capable of operating at more than one frequency, which enables tunable receiving coil to measure at least two gyromagnetic nuclei (e.g., $^1$H and $^{13}$C) during an MRI. While the present discussion may be directed toward a MRI system having a dual-frequency receiving coil for analyzing both $^1$H and $^{13}$C nuclei, it should be appreciated other embodiments may include one or more receiving coils capable of operating at more than two frequencies (e.g., 3, 4, or 5 frequencies) and/or capable of measuring other nuclei (e.g., $^{19}$F, $^{23}$Na, $^{31}$P, etc.). Furthermore, as set forth in detail below, the presently disclosed receiving coil embodiments include a frequency tuning component and an impedance matching component that together enable the receiving coil to operate at more than one frequency while maintaining approximately the same impedance. Additionally, in certain embodiments, an MRI system may include two or more receiver chains, each receiver chain configured to receive a signal from the receiving coil for a certain nucleus and to prepare the signal for the receiver of the MRI system.

With the foregoing in mind, the implementations described herein may be performed by a magnetic resonance imaging (MRI) system that may perform data acquisition, data construction, and image synthesis. Accordingly, referring to FIG. 1, a magnetic resonance imaging system 10 is illustrated schematically as including a scanner 12, a scanner control circuit 14, and a system control circuitry 16. System 10 additionally includes remote access and storage systems or devices as picture archiving and communication systems (PACS) 18, or other devices such as teleradiology equipment so that data acquired by the system 10 may be accessed on- or off-site. While the MRI system 10 may include any suitable scanner or detector, in the illustrated embodiment, the system 10 includes a full body scanner 12 having a housing 20 through which a bore 22 is formed. A table 24 is moveable into the bore 22 to permit a patient 26 to be positioned therein for imaging selected anatomy of the patient 26. The selected anatomy may be imaged by a combination of patient positioning, selected excitation of certain gyromagnetic nuclei within the patient 26, and by using certain features for receiving data from the excited nuclei as they spin and process, as described below.

Figure 1:
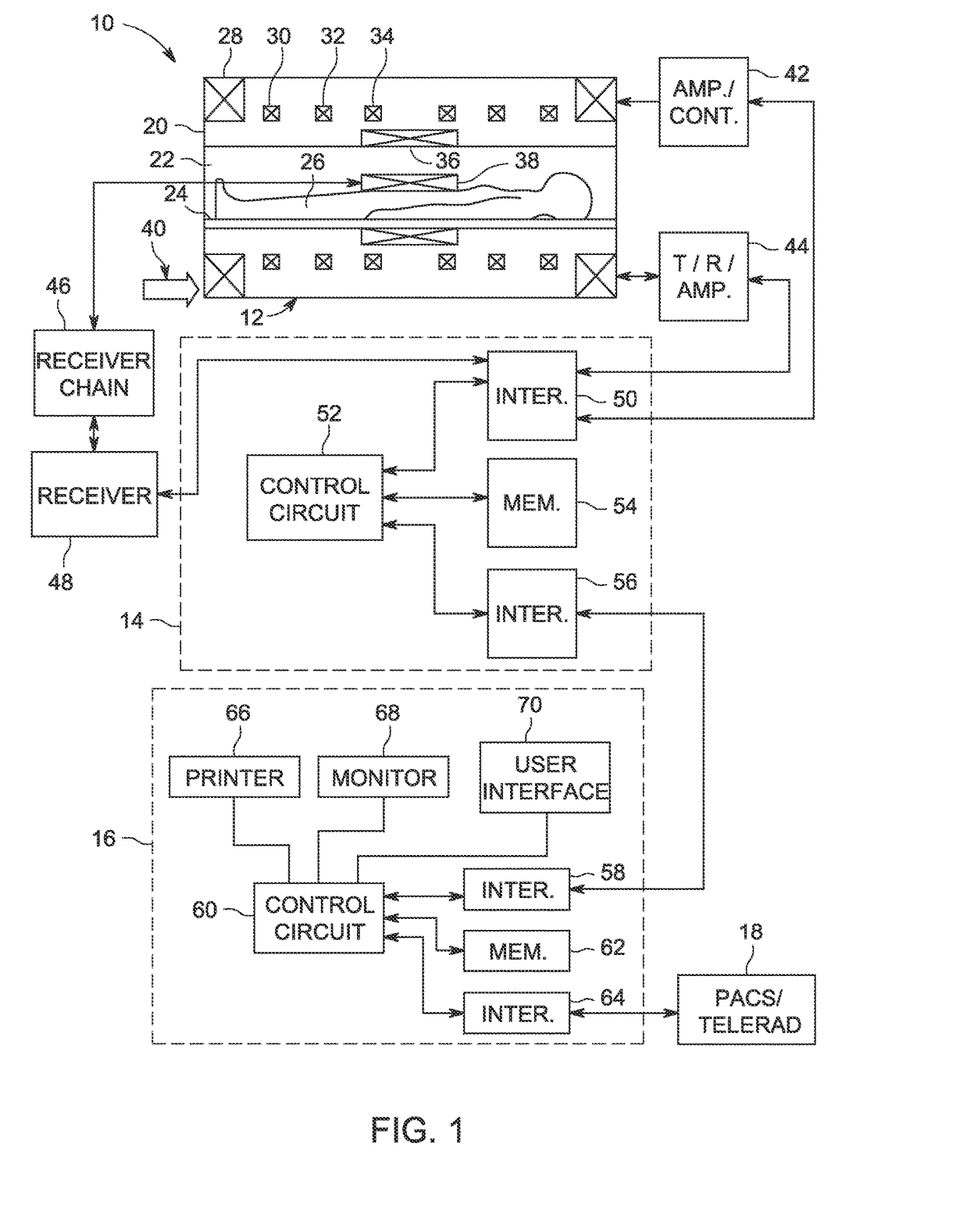
FIG. 1 is a block diagram illustrating an embodiment of a magnetic resonance imaging (MRI) system utilizing one or more multi-nuclear MR receiving coils.

Scanner 12 includes a series of associated coils for producing controlled magnetic fields for exciting the gyromagnetic material within the anatomy of the subject being imaged. Specifically, a primary magnet coil 28 is provided for generating a primary magnetic field generally aligned with the bore 22. When the patient 26 is placed within the scanner 12, the gyromagnetic nuclei equilibrate their magnetization by generally aligning their spins perpendicular to the field of the primary magnet coil 28. While the present discussion may be directed toward a field strength of approximately 3 tesla (T) being generated by the primary magnet coil 28, it should be appreciated that the present approach may be applied using other field strengths (e.g., 1.5 T) as well, adjusting for the different resonance frequencies of the gyromagnetic nuclei at the other field strength. A series of gradient coils 30, 32, and 34 permit controlled magnetic gradient fields to be generated for positional encoding of certain of the gyromagnetic nuclei during examination sequences. A radio frequency (RF) scanner coil 36 is provided for generating radio frequency pulses for exciting the certain gyromagnetic nuclei within the patient.

In addition to the coils that may be localized to and/or within the scanner 12, the system 10 also includes a set of multi-nuclear receiving coils 38 configured for placement proximal to the patient 26. As an example, the multi-nuclear receiving coils 38 can include cervical/thoracic/lumbar (CTL) coils, head coils, and so forth. Generally, the multi-nuclear receiving coils 38 may be placed close to or on top of the patient 26 so as to receive the weak RF signals (e.g., weak relative to the transmitted pulses generated by the scanner coils 36) that are generated by certain of the gyromagnetic nuclei within the patient 26 as they return to alignment with the field generated by the primary coil magnet 28. In accordance with present embodiments, the multi-nuclear receiving coils 38 may be switched off so as not to receive or resonate with the transmit pulses generated by the scanner coils 36, and may be switched on so as to receive or resonate with the RF signals generated by the relaxing gyromagnetic nuclei.

The various coils of system 10 are controlled by external circuitry to generate the desired field and pulses, and to read emissions from the gyromagnetic material in a controlled manner. That is, in some embodiments, the circuitry may be disposed at a distance away from scanner 12 so as to avoid any interference resulting from the transmitted RF pulses and/or the bulk magnetic field. Such a distance may include having the circuitry in a separate room, at a separate facility, and so on. In the illustrated embodiment, a main power supply 40 provides power to the primary field coil 28. A driver circuit 42 is provided for pulsing the gradient field coils 30, 32, and 34. Such a circuit typically includes amplification and control circuitry for supplying current to the coils as defined by digitized pulse sequences output by the scanner control circuit 14. Another control circuit 44 is provided for regulating operation of the RF coil 36. Circuit 44 includes a switching device for alternating between the active and inactive modes of operation, wherein the RF coil 36 transmits and does not transmit signals, respectively. Circuit 44 also includes amplification circuitry for generating the RF pulses.

In accordance with the present approaches, the receiving coils 38 may be coupled to the receiver 48 via a receiver chain 46. As discussed in greater detail below, in certain embodiments, the MRI system 10 may include one or more receiver chains 46, each of which may include one or more multiplexing and/or amplification circuits configured to handle the signals from the receiving coils 38 at a particular frequency. Furthermore, as set forth below, the system 10 may utilize different receiver chains 46 to process signals from different analyzed nuclei (e.g., $^1$H and $^{13}$C). Additionally, a receiver 48 is provided for receiving the signal detected by the receiving coils 38 and processed by the appropriate receiver chain 46. The configuration of the receiver chain 46 and the receiving coils 38 are described in greater detail below.

Scanner control circuit 14 includes an interface circuit 50 for outputting signals for driving the gradient field coils 30, 32, 34 and the RF coil 36. Additionally, interface circuit 50 receives the data representative of the magnetic resonance signals produced in examination sequences from the receiving circuitry 48 and/or the receiving coils 38. The interface circuit 50 is operatively connected to a control circuit 52. The control circuit 52 executes the commands for driving the circuit 42 and circuit 44 based on defined protocols selected via system control circuit 16. Control circuit 52 also serves to provide timing signals to, for example, synchronize the transmission and reception of RF energy in the receiving coils 38 and to switch the receiving coils 38 between different frequencies, as discussed below. Further, control circuit 52 receives the magnetic resonance signals and may perform subsequent processing before transmitting the data to system control circuit 16. Scanner control circuit 14 also includes one or more memory circuits 54, which store configuration parameters, pulse sequence descriptions, examination results, and so forth, during operation. Interface circuit 56 is coupled to the control circuit 52 for exchanging data between scanner control circuit 14 and system control circuit 16. Such data will typically include selection of specific examination sequences to be performed, configuration parameters of these sequences, and acquired data, which may be transmitted in raw or processed form from scanner control circuit 14 for subsequent processing, storage, transmission and display.

An interface circuit 58 of the system control circuit 16 receives data from the scanner control circuit 14 and transmits data and commands back to the scanner control circuit 14. The interface circuit 58 is coupled to a control circuit 60, which may include one or more processing circuits in a multi-purpose or application specific computer or workstation. Control circuit 60 is coupled to a memory circuit 62, which stores programming code for operation of the MRI system 10 and, in some configurations, the processed image data for later reconstruction, display and transmission. An additional interface circuit 64 may be provided for exchanging image data, configuration parameters, and so forth with external system components such as remote access and storage devices 18. Finally, the system control circuit 60 may include various peripheral devices for facilitating operator interface and for producing hard copies of the reconstructed images. In the illustrated embodiment, these peripherals include a printer 66, a monitor 68, and user interface 70 including devices such as a keyboard or a mouse.

Figure 2:
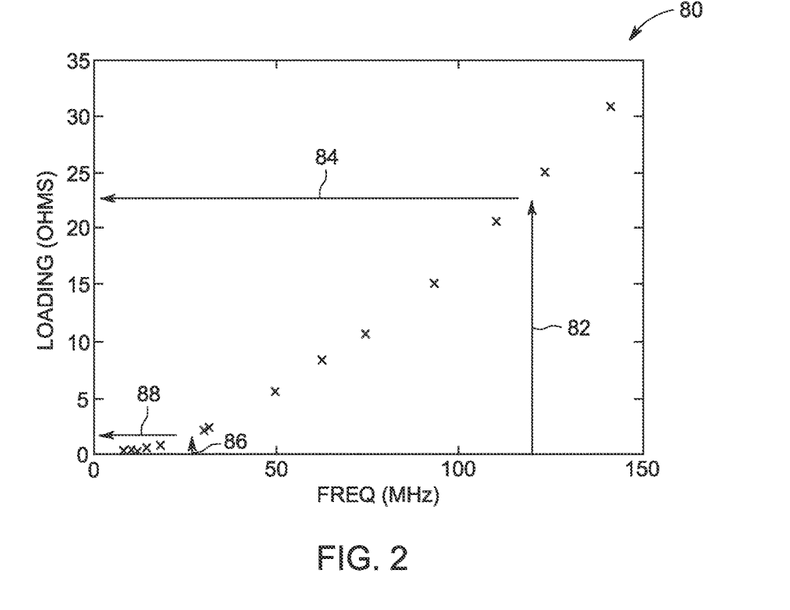
FIG. 2 is a graph illustrating coil loading as a function of frequency for a receiving coil lacking the presently disclosed impedance matching feature, wherein the receiving coil is on a loading phantom and each data point is representative of the coil loading when coil is tuned to frequency of corresponding value on x-axis.

As set forth above, the MRI system 10 illustrated in FIG. 1 may include multi-nuclear receiving coils 38 that are capable of measuring RF signals from at least two gyromagnetic nuclei. To better illustrate one challenge in operating a receiving coil at various frequencies, FIG. 2 is a graph 80 illustrating coil loading versus coil frequency for a receiving coil lacking the frequency tuning component and impedance match component discussed in detail below. More specifically, the data illustrated in the graph 80 corresponds to an experiment in which a 15 cm receiving coil is placed on a phantom and tuned over a range of frequencies while the coil loading is measured. As illustrated in FIG. 2, with nothing being done to mitigate the effect, the loading of the coil increases significantly as the frequency of the coil is increased. Consequently, an impedance mismatch may be result between the coil and the next stage of the receiver chain, which may be, for example, a coaxial cable, transmission line, or low-noise amplifier. Such an impedance mismatch may lead to poor signal transfer and, therefore, poor image quality.

By specific example, the graph 80 of FIG. 2 illustrates that at a frequency of approximately 128 MHz (indicated by the arrow 82), the loading of the coil may be approximately 23 ohms (indicated by the arrow 84). In contrast, the graph 80 also illustrates that at a frequency of approximately 32 MHz (indicated by the arrow 86), the loading of the coil may be approximately 2 ohms (indicated by the arrow 88). Accordingly, when moving between the resonant frequency of $^1$H (e.g., approximately 128 MHz at 3.0 T) and the resonant frequency of $^{13}$C (e.g., approximately 32 MHz at 3.0 T) a significant change in impedance may be encountered. As such, as set forth in detail below, the multi-nuclear receiving coils 38 presently disclosed include a frequency tuning component and an impedance matching component that enable the multi-nuclear receiving coils 38 to maintain substantially the same impedance regardless of the frequency of the coil.

Figure 3:
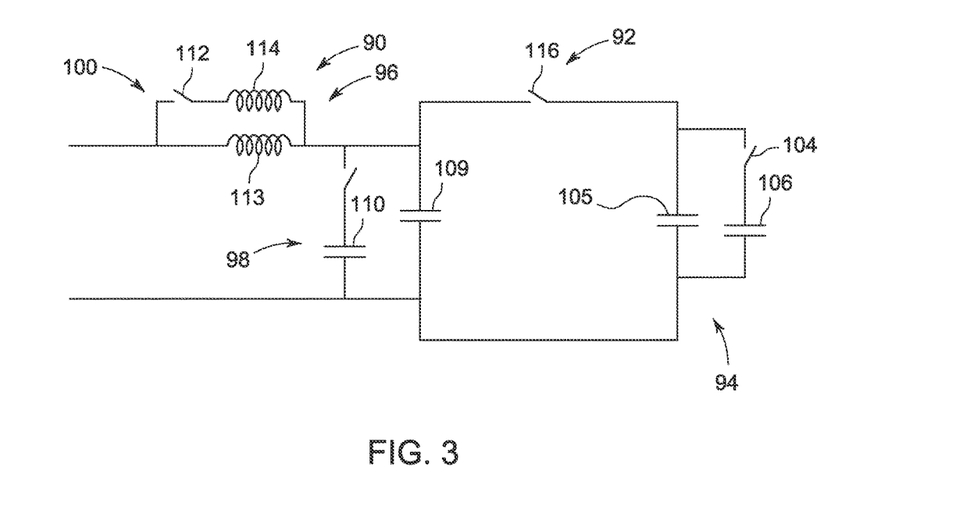
FIG. 3 is a block diagram illustrating certain components of a multi-nuclear MR receiving coil, in accordance with an embodiment of the present approach.

With the foregoing in mind, FIG. 3 is a block diagram illustrating certain components of a multi-nuclear receiving coil 90, which may be one receiving coil of the plurality or array of receiving coils 38 of the MRI system 10. Further, the receiving coil 90 is capable of operating at more than one frequency, in accordance with an embodiment of the present approach. It should be appreciated that, while a single receiving coil 90 may be illustrated and discussed below, in certain embodiments, the MRI system 10 may be equipped with a plurality of multi-nuclear receiving coils 90 (e.g., in an array). The multi-nuclear receiving coil 90 illustrated in FIG. 3 includes a coil portion 92, a frequency tuning component or circuit 94, and an impedance matching component or circuit 96. More specifically, the impedance matching component 96 includes a capacitance matching portion 98 and an inductance matching portion 100. As the impedance matching component 96, the capacitance matching portion 98 and the inductance matching portion 100 cooperate to modify the impedance of the receiving coil 90. It should also be appreciated that both the frequency tuning component 94 and the impedance matching component 96 may affect the frequency of the receiving coil 90, and as such, may cooperate to set the receiving coil 90 to the appropriate frequency and impedance.

In particular, the impedance matching component 96 may generally ensure that the impedance of the receiving coil 90 remains substantially the same (e.g., remains approximately constant) as the frequency of the receiving coil 90 varies. More specifically, the impedance matching component 96 may enable the receiving coil 90 to maintain a particular impedance value to ensure efficient signal transmission regardless of the frequency of the receiving coil 90. For example, in certain embodiments, the impedance matching component 96 may enable the receiving coil 90 to maintain an impedance of approximately 50 ohms to match the impedance of the cabling. It should be appreciated that, in certain embodiments, the impedance matching component may be configured to maintain a impedance that changes less than 10%, 8%, 6%, 5%, 3%, 2%, or 1% as the receiving coil 90 is switched between frequencies.

The frequency tuning component 94 of the receiving coil 90 illustrated in FIG. 3 includes a switch 104, a first capacitor 105, and a second capacitor 106. It should be appreciated that when the switch 104 is open, only the first capacitor 105 of the frequency tuning component 94 is activated (e.g., energized). However, when the switch 104 is closed, both the capacitor 105 and the capacitor 106 of the frequency tuning component 94 are activated, modifying the frequency of the receiving coil 90. Likewise, the capacitance matching portion 98 of the impedance matching component 96 also includes a switch 108, a first capacitor 109, and a second capacitor 110. When the switch 108 is open, only the first capacitor 109 of the capacitance matching portion 98 is activated. However, when the switch 108 is closed, both the capacitor 109 and the capacitor 110 of the capacitance matching portion 98 are activated, modifying the capacitance of the receiving coil 90. Similarly, the inductance matching portion 100 of the impedance matching component 96 includes a switch 112, a first inductor 113, and a second inductor 114. When the switch 112 is open, only the inductor 113 of the inductance matching portion 100 is activated. However, when the switch 112 is closed, the both the inductor 113 and the inductor 114 are activated, which alters the inductance of the receiving coil 90. In certain embodiments, the switches 104, 108, and 112 may be controlled by the scanner control circuit 14 or system control circuitry 16 of the MRI system 10 based on the instructions of the user.

It should be appreciated that the capacitors 109 and 110 of the capacitance matching portion 98, like the capacitors 105 and 106 of the frequency tuning component 94, may generally affect the frequency of the receiving coil 90. Similarly, the capacitors 105 and 106 of the frequency tuning component 94 may generally affect the capacitance of the receiving coil 90. As such, while the receiving coil 90 illustrated in FIG. 3 is logically divided into the frequency tuning component 94, the impedance matching component 96, and the inductance matching portion 100, in operation, these components may generally cooperate with one another to change the frequency of the receiving coil 90 while maintaining a particular impedance.

The coil portion 92 of the receiving coil 90 illustrated in FIG. 3 may include a number of capacitors (discussed below) as well as a switch 116 that, when opened, deactivates the receiving coil 90 to prevent damage to the receiving coil and/or injury to the patient when the scanning coils 36 are transmitting. As such, it should be appreciated that the switch 116 may switch open and closed hundreds of times per second during the course of an acquisition. In contrast, the switches 104, 108, and 112 may only be switched to adjust the frequency and impedance of the receiving coil 90, which may generally occur when the receiving coil 90 is switching from measuring a first nucleus (e.g., $^{1}H$) to measuring a second nucleus (e.g., $^{13}C$), or vice versa.

The switches 104, 108, 112, and 116 may be any suitable switch (e.g., a single pole single throw switch) having a low on-resistance and low-capacitance for fast switching. More specifically, due to the environment within the MRI system 10 during an acquisition, the switches 104, 108, 112, and 116 should be capable of functioning properly in the strong fields produced by the coils of the MRI system 10. In particular, microelectromechanical system (MEMS) switches may be utilized for one or more of the switches 104, 108, 112, and 116 as they may afford the desired low on-resistance, low parasitic capacitance as well as the ability to function properly in the environment of the MRI system 10. For example, in certain embodiments, one or more of the switches 104, 108, 112, and 116 may include a MEMS switch embodiment described in U.S. application Ser. No. 11/961,737, entitled, "MEMS MICROSWITCH HAVING A DUAL ACTUATOR AND SHARED GATE," which is incorporated by reference herein in its entirety for all purposes. In certain embodiments, one or more of the switches 104, 108, 112, and 116 may include a MEMS switch embodiment described in U.S. Pat. No. 8,054,147, entitled, "HIGH VOLTAGE SWITCH AND METHOD OF MAKING," which is incorporated by reference herein in its entirety for all purposes. Additionally, in certain embodiments, one or more of the switches 104, 108, 112, and 116 may include a MEMS switch embodiment described in U.S. Pat. No. 7,928,333, entitled, "SWITCH STRUCTURES"; described in U.S. Pat. No. 7,692,519, entitled, "MEMS SWITCH WITH IMPROVED STANDOFF VOLTAGE CONTROL"; described in U.S. Pat. No. 7,609,136, entitled, "MEMS MICROSWITCH HAVING A CONDUCTIVE MECHANICAL STOP"; or described in U.S. Pat. No. 7,605,466, entitled, "SEALED WAFER PACKAGING OF MICROELECTROMECHANICAL SYSTEMS"; which are all incorporated by reference herein in their entirety for all purposes.

For example, in certain embodiments, the switches 104, 108, 112, and 116 may be able to switch in approximately 300 μs or less, 200 μs or less, or 100 μs or less. In certain embodiments, the switches 104, 108, 112, and 116 may capable of handling voltages in excess of 400 V, in excess of 500 V, or in excess of 600 V. Additionally, in certain embodiments, the switches 104, 108, 112, and 116 may have a relatively low contact resistance (e.g., less than 10 ohms, less than 5 ohm, less than 1 ohm, less than 0.5 ohms, or other suitably low contact resistance). Further, in certain embodiments, the switches 104, 108, 112, and 116 may have a substantially low on-resistance (e.g., less than 1 ohm, less than 0.5 ohms, less than 0.1 ohm, or other suitable low on-resistance). Also, in certain embodiments, the switches 104, 108, 112, and 116 may also afford a relatively high number of switching cycles (e.g., $10^7$-$10^9$ switching cycles).

Figure 4:
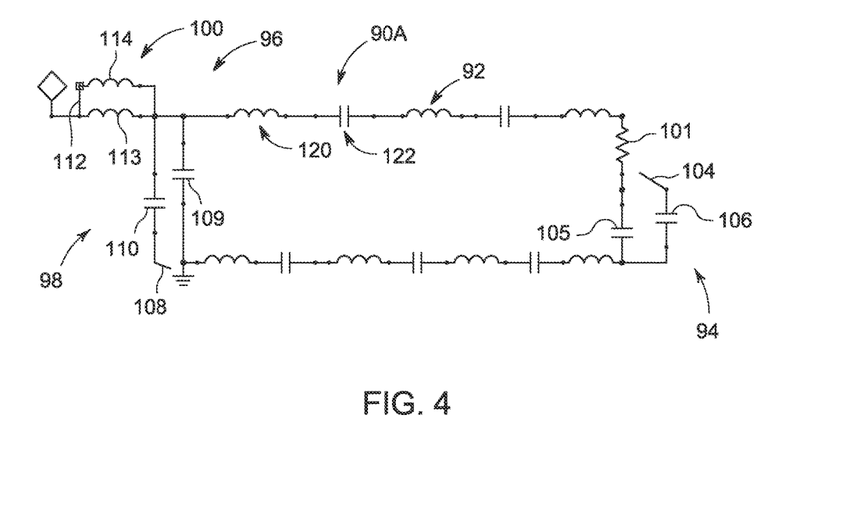
FIG. 4 is a representative circuit diagram illustrating the embodiment of the multi-nuclear receiving coil of FIG. 3 tuned to approximately 128 MHz for $^1$H analysis at a coil loading of 23 ohms and the impedance matched to approximately 50 ohms.

To better illustrate how the receiving coil 90 switches between two frequencies (e.g., 128 MHz and 32 MHz) while maintaining substantially the same impedance (e.g., 50 ohms), FIG. 4 is a representative circuit diagram illustrating an example embodiment of a 15 cm receiving coil 90A that has been tuned to a frequency of 128 MHz (e.g., for $^1$H observation at 3 T) and matched to an impedance of 50 ohms. The coil portion 92 of the receiving coil 90A includes a number of discrete capacitors 122 (e.g., each having a capacitance of approximately 378 picofarads (pF)). The sections (e.g., copper traces) of the receiving coil 90 disposed between the capacitors are represented by the inductors 120 (e.g., each having an inductance of approximately 63 nano Henries (nH)). Further, the sample loading for the receiving coil 90 illustrated in FIG. 4 is 23 ohms, as represented by the resistor 101, which is consistent with the coil loading illustrated in the graph of 80 of FIG. 2.

Furthermore, for the receiving coil 90A illustrated in FIG. 4, the switch 104 of the frequency tuning component 94 is open such that only the capacitor 105 (e.g., having a capacitance of approximately 4 pF) is activated, while the other capacitor 106 (e.g., having a capacitance of approximately 374 pF) is not activated and does not affect the frequency of the receiving coil 90A. With regard to the impedance matching component 96, the switch 108 of the capacitance matching portion 98 is illustrated as open such that only the capacitor 109 (e.g., having a capacitance of approximately 37 pF) of the capacitance matching portion 98 is activated, while the other capacitor 110 (e.g., having a capacitance of approximately 458 pF) is not activated and does not affect the capacitance of the receiving coil 90A. Furthermore, as illustrated, the switch 112 of the inductance matching portion 100 of the impedance matching component 96 is closed such that both the inductor 113 (e.g., having an inductance of approximately 49 nH) and the inductor 114 (e.g., having an inductance of approximately 286 nH) are activated and affect the inductance of the receiving coil 90A. Accordingly, when the receiving coil 90 is configured to have the switch 104 open, the switch 108 open, and the switch 112 closed, the receiving coil 90 is configured for $^1$H measurement at 3 T (e.g., tuned to a frequency of 128 MHz and matched to an impedance of 50 ohms). It should be noted that the switch 116 illustrated in FIG. 3, which is opened during transmit pulse transmission, is not shown in the example of frequency tuning and impedance matching illustrated in FIG. 4, and has no impact on frequency tuning and impedance matching.

Figure 5:
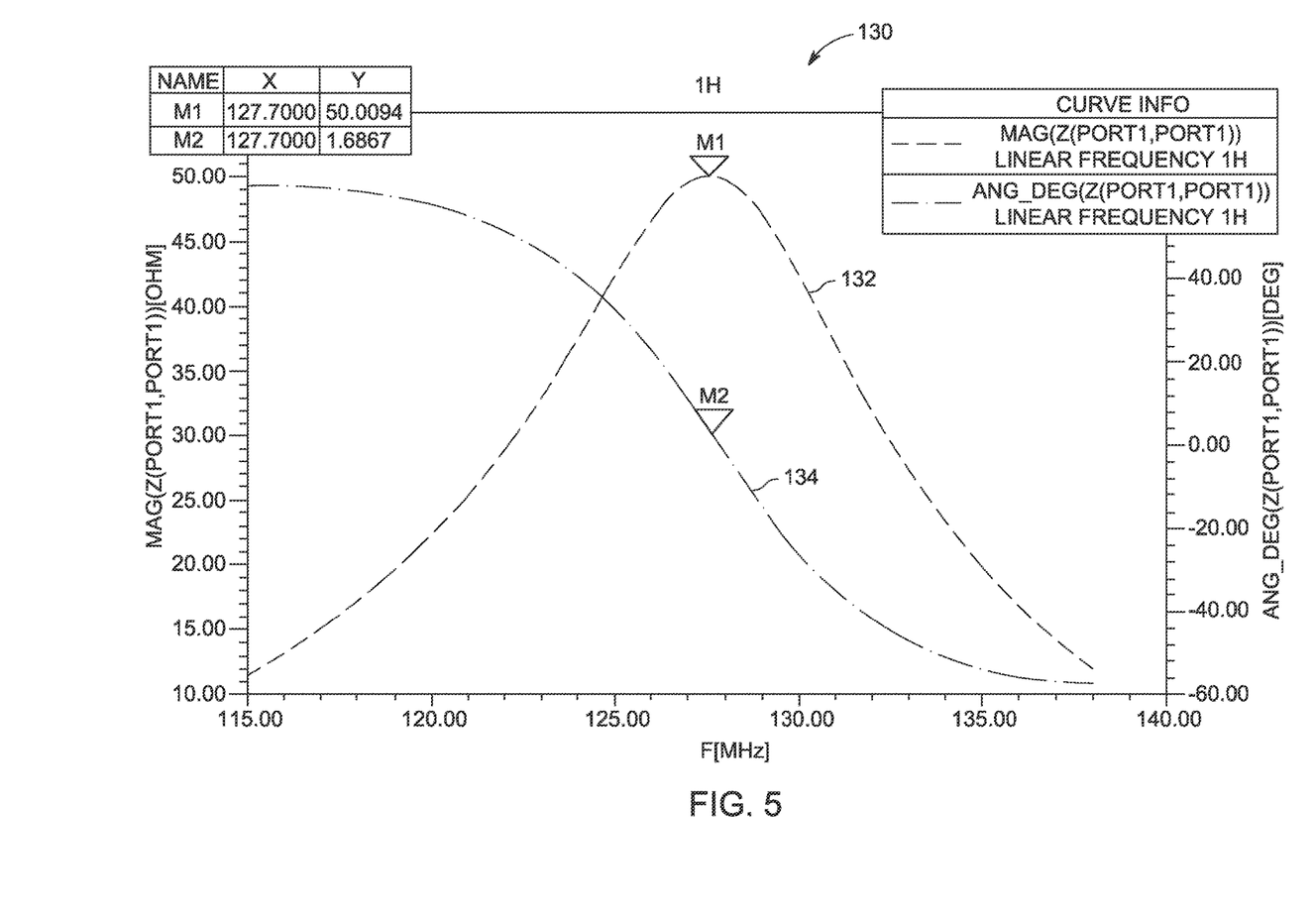
FIG. 5 is a graph illustrating the frequency tuning, impedance matching, and phase of the receiving coil of FIG. 4.

Accordingly, FIG. 5 is a graph 130 illustrating the frequency tuning, impedance matching, and the phase of the receiving coil 90A of FIG. 4. The graph 130 of FIG. 5 plots impedance versus frequency for the receiving coil 90A embodiment described above. Further, the graph 130 includes a resonance peak 132 centered at a frequency of approximately 127.7 MHz and having an impedance value of approximately 50 ohms. Additionally, the graph 130 also includes the phase curve 134, illustrating that the phase is approximately zero at the frequency of approximately 127.7 MHz.

Figure 6:
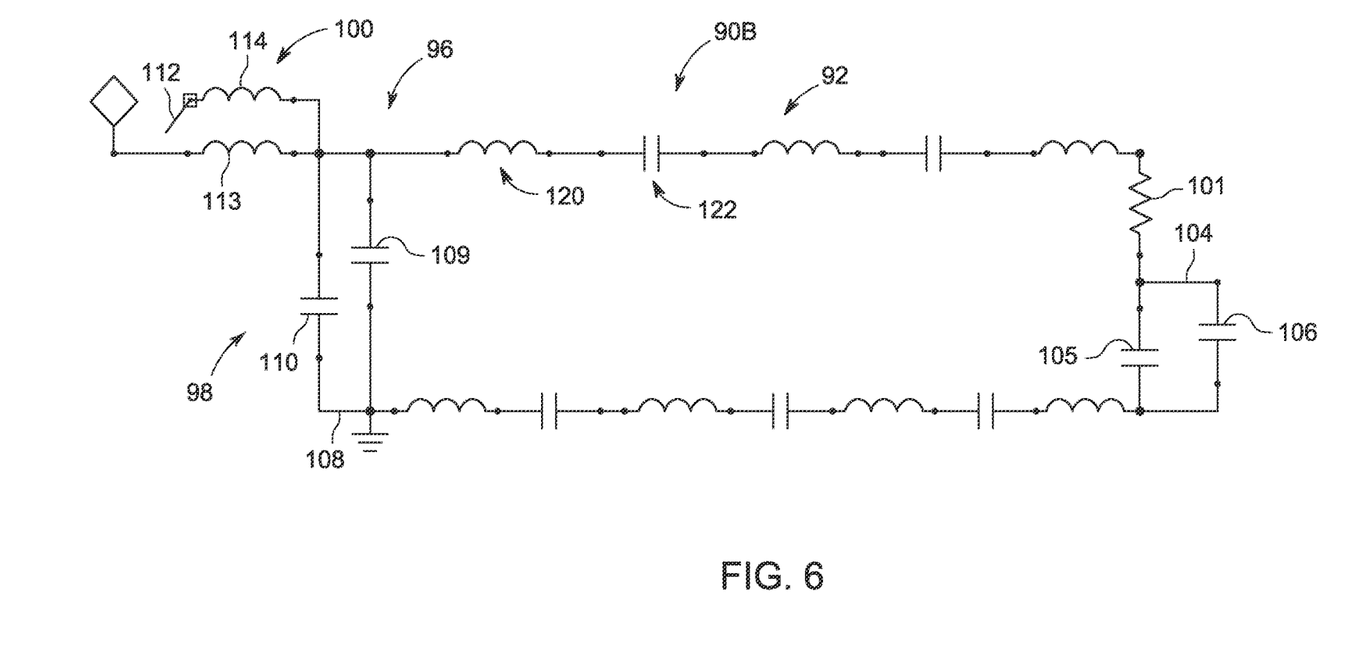
FIG. 6 is a circuit diagram illustrating the embodiment of the multi-nuclear receiving coil of FIG. 3 tuned to approximately 32 MHz for $^{13}$C analysis at a coil loading of 2 ohms and the impedance matched to approximately 50 ohms.

FIG. 6 is a circuit diagram illustrating an example embodiment of the 15 cm receiving coil 90A of FIG. 4, but having now been tuned to a frequency of 32 MHz (e.g., for $^{13}$C observation at 3 T) and matched to an impedance of 50 ohms. The components of the receiving coil 90B are identical to the components of the receiving coil 90A of FIG. 4 discussed above. Further, the sample loading for the receiving coil 90 illustrated in FIG. 5 is 2 ohms, as represented by the resistor 101, which is consistent with the coil loading illustrated in the graph of 80 of FIG. 2.

In contrast with FIG. 5, the receiving coil 90B illustrated in FIG. 6 includes the switch 104 of the frequency tuning component 94 in a closed position such that both capacitor 105 and capacitor 106 are activated and modify the frequency of the receiving coil 90B. Further, the receiving coil 90B also includes the switch 108 in a closed position such that both capacitor 109 and capacitor 110 of the capacitance matching portion 98 of the impedance matching component 96 are activated and modify the capacitance of the receiving coil 90B. Additionally, the receiving coil 90B also includes the switch 112 in an open position such that only inductor 113 of the inductance matching portion 100 of the impedance matching component 96 is activated and modifies the inductance of the receiving coil 90B. Accordingly, when the receiving coil 90 is configured with the switch 104 closed, the switch 108 closed, and the switch 112 open, the receiving coil 90 is configured for $^{13}$C measurement at 3 T (e.g., tuned to a frequency of approximately 32 MHz and matched to an impedance of 50 ohms).

Figure 7:
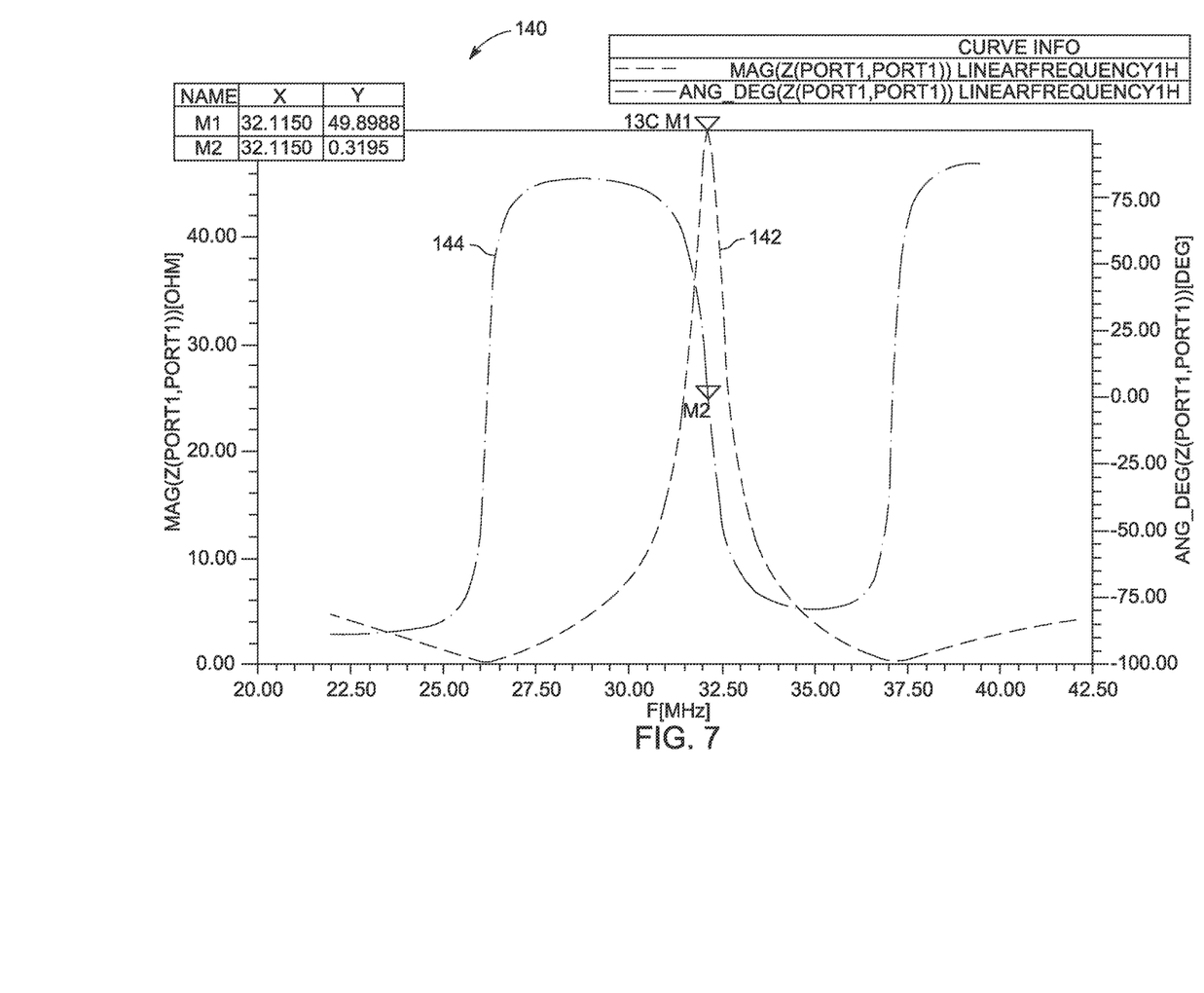
FIG. 7 is a graph illustrating the frequency tuning, impedance matching, and phase of the receiving coil of FIG. 6.

Accordingly, FIG. 7 is a graph 140 illustrating the frequency tuning, impedance matching, and phase of the receiving coil 90B of FIG. 6. The graph 140 of FIG. 7 plots impedance versus frequency for the receiving coil 90B embodiment described above. Further, the graph 140 includes a resonance peak 142 centered at a frequency of approximately 32.115 MHz and having an impedance value of approximately 50 ohms. Additionally, the graph 140 also includes the phase curve 144, illustrating that the phase is approximately zero at the frequency of approximately 32.115 MHz.

Figure 8:
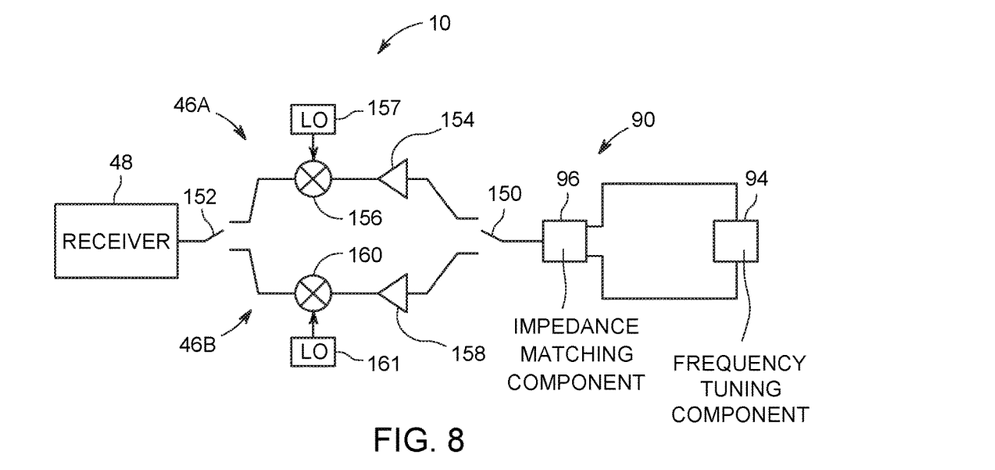
FIG. 8 is a block diagram of an embodiment of a multi-nuclear receiving coil coupled to the receiver via a plurality of receiver chains.

As mentioned above, the MRI system 10 illustrated in FIG. 1 may include a number of receiver chains 46, each equipped to process the signal from the receiving coil 90 and deliver the signal to the receiver 48. Accordingly, in certain embodiments, the receiving coil 90 may be coupled to the receiver 48 as illustrated in FIG. 8. As illustrated in FIG. 8, the receiving coil 90, including the frequency tuning component 94 and the impedance matching component 96, is coupled to a switch (e.g., the single pole double throw switch 150) such that the switch 150 can selectively couple the receiving coil 90 to the appropriate receiver chain 46 (e.g., receiver chain 46A or 46B). For example, when the receiving coil 90 is tuned to a frequency of approximately 128 MHz to observe $^1$H nuclei at 3 T, the receiving coil 90 may be coupled to the receiver chain 46A. Similarly, when the receiving clone 90 is tuned to a frequency of approximately 32 MHz to observe $^{13}$C nuclei at 3 T, the receiving coil 90 may be coupled to the receiver chain 46B. The receiver 48 illustrated in FIG. 8 is coupled to a switch (e.g., the single pole double throw switch 152) that further enables the receiver 48 to be coupled to the appropriate receiver chain (e.g., receiver chain 46A or 46B). Accordingly, the switches 150 and 152 may be collectively referred to as receiver chain selection switches, and, like the switches 104, 108 and 112 of the receiving coil 90, the receiver chain selection switches may be controlled by the scanner control circuit 14 or system control circuitry 16 of the MRI system 10.

The receiver chain 46A illustrated in FIG. 8 includes a low-noise amplifier 154 (e.g., a 128 MHz amplifier) to amplify the $^1$H signal received from the receiving coil 90. The receiver chain 46A also includes a mixer 156 that is configured to convert the $^1$H (e.g., 128 MHz) signal to a particular frequency (e.g., 16 MHz) to be provided to the receiver 48. Further, the illustrated mixer 156 receives a signal from a local oscillator 157 that may be used when converting the signal received from the receiving coil 90 to a different frequency to be received by the receiver 48. The receiver chain 46B illustrated in FIG. 8 includes a low-noise amplifier 158 (e.g., a 32 MHz amplifier) to amplify the $^{13}$C signal received from the receiving coil 90. The receiver chain 46B also includes a mixer 160 that is configured to convert the $^{13}$C signal (e.g., 32 MHz) a particular frequency (e.g., 16 MHz) to be provided to the receiver 48. Further, the illustrated mixer 160 receives a signal from a local oscillator 161 that may be used when converting the signal received from the receiving coil 90 to a different frequency to be received by the receiver 48. Accordingly, in certain embodiments, the receiver chains 46A and 46B may both receive signals at the frequency of the receiving coil 90 when observing a particular nucleus (e.g., 128 MHz and 32 MHz, respectively), and may both convert and provide signals to the receiver 48 at approximately the same frequency (e.g., 16 MHz).

Figure 9:
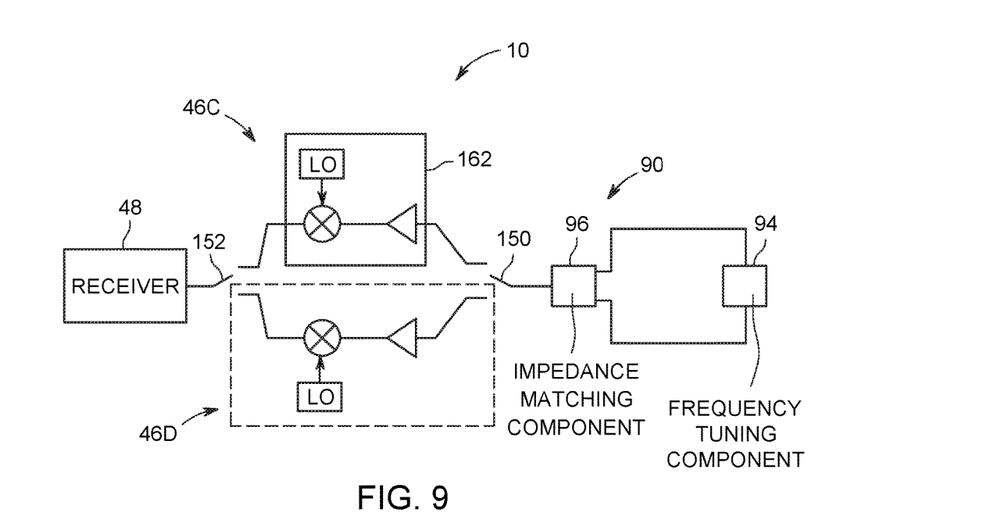
FIG. 9 is a block diagram of another embodiment of the multi-nuclear receiving coil coupled to the receiver via at least one receiver chain.

In another embodiment, illustrated in FIG. 9, a MRI system 10 may include the receiving coil 90 (including the frequency tuning component 94 and the impedance matching component 96) and the receiver 48. Additionally, the embodiment illustrated in FIG. 9 includes two receiver chains 46C and 46D. The receiver chain 46C utilizes a 128 MHz low-noise amplifier and mixer 162 that both amplifies and converts the 128 MHz signal received from the receiving coil 90 within a single device. Further, for the illustrated embodiment, only the receiver chain 46C is provided with the original equipment, while the receiver chain 46D may be added to the MRI system 10 at a later time (e.g., add-on or upgrade equipment). In this manner, for certain embodiments, the MRI system 10 may be considered "Multi-nuclear Ready" based on the inclusion of the multi-nuclear receiving coil 90, but may not actually be capable of multinuclear imaging until the second receiver chain 46D has been installed on the system 10.

Figure 10:
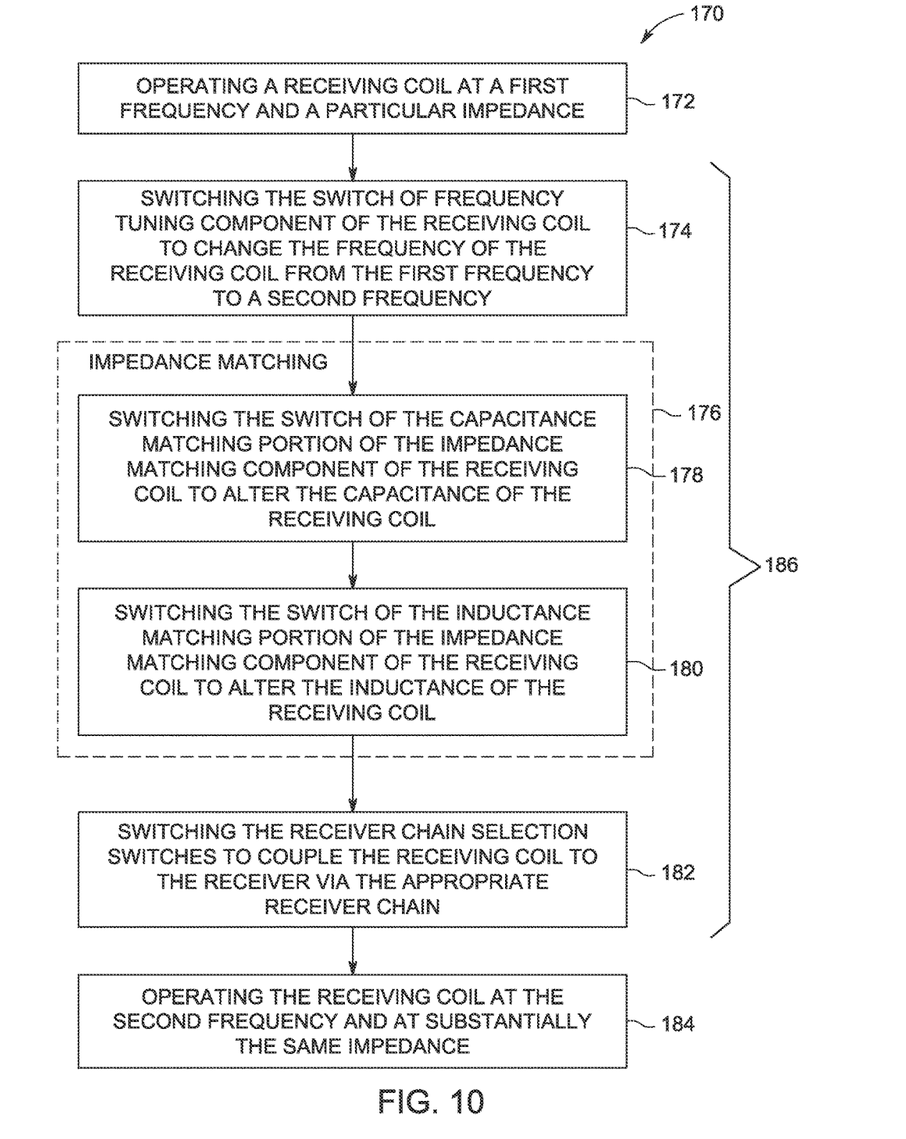
FIG. 10 is a flow diagram illustrating an embodiment of a method by which the receiving coil of FIG. 3 may be switched from a first frequency to a second frequency.

It should be appreciated that there are a number of switches (e.g., switches 104, 108, 112, 150, and 152) disposed within the present MRI system 10 that may be switched to cause the MRI system 10 to acquire a signal from a particular nucleus. For example, FIG. 10 illustrates an embodiment of a method 170 for switching the MRI system 10 from a first frequency (e.g., 128 MHz) to a second frequency (e.g., 32 MHz) to measure a different gyromagnetic nucleus. It is noted that, in certain embodiments, one or more of the switching events set forth in FIG. 10 may occur simultaneously. The method 170 begins with the MRI system being operated (block 172) at a first frequency (e.g., 128 MHz) that corresponds to a particular impedance (e.g., 50 ohms). The method continues with switching (block 174) the switch 104 of the frequency tuning component 94 of the receiving coil 90. For example, the switch 104 may move from an open position (e.g., for $^1$H measurement at 128 MHz at 3 T) to a closed position (e.g., for $^{13}$C measurement at 32 MHz at 3 T).

The method 170 illustrated in FIG. 10 continues with impedance matching 176. As illustrated in FIG. 10, impedance matching 176 includes switching (block 178) the switch 108 of the capacitance matching portion 98 of the impedance matching portion 96 to alter the capacitance of the receiving coil 90. For example, the switch 108 may move from an open position (e.g., for $^1$H measurement at 128 MHz) to a closed position (e.g., for $^{13}$C measurement at 32 MHz) to adjust the capacitance of the receiving coil 90. The impedance matching 176 also includes switching (block 180) the switch 112 of the inductance matching portion 98 of the impedance matching component 96 to alter the inductance of the receiving coil 90. For example, the switch 112 may move from a closed position (e.g., for $^1$H measurement at 128 MHz) to an open position (e.g., for $^{13}$C measurement at 32 MHz).

The method 170 illustrated in FIG. 10 continues with switching (block 182) the receiver chain selection switches (e.g., switches 150 and 152 illustrated in FIGS. 8 and 9) to couple the receiving coil 92 the receiver 48 via the appropriate receiver chain 46. Finally, the method 170 completes as the MRI system 10 is operated (block 184) at the second frequency (e.g., 32 MHz) and at substantially the same impedance (e.g., approximately 50 ohms). It should be appreciated that, in certain embodiments, blocks 174 through 182 (denoted by the bracket 186) may be executed at substantially the same time (e.g., synchronized with 10 seconds of one another, within 1 second of one another, less than 1 second of one another).

Technical effects of the present approach include the ability to measure more than one gyromagnetic nucleus using the same receiving coil or set of receiving coils. Since the receiving coil to need not be replaced between measurements of different nuclei, the present approach enables imaging to be carried out in less time, which increases patient throughput and improves utilization of the MRI system 10. Further, the ability to measure both gyromagnetic nuclei without having to change out the receiving coils provides images that are better co-registered with one another and enables MRI studies that are more sensitive to time delay (e.g., metabolic studies).

This written description uses examples to disclose the invention, including the best mode, and also to enable any person skilled in the art to practice the invention, including making and using any devices or systems and performing any incorporated methods. The patentable scope of the invention is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal languages of the claims.

The invention claimed is:

1. A system, comprising:
   a multi-nuclear magnetic resonance (MR) receiving coil, wherein the receiving coil comprises:
      a frequency tuning component configured to operate the receiving coil at either a first frequency or a second frequency; and
      an impedance matching component configured to maintain a substantially constant impedance of the receiving coil when the receiving coil is operated at either the first frequency or the second frequency;
   wherein the receiving coil is configured to measure a first nucleus when operated at the first frequency, and wherein the receiving coil is configured to measure a second nucleus when operated at the second frequency.

2. The system of claim 1, wherein the frequency tuning component comprises a microelectromechanical system (MEMS) switch coupled to a capacitor, wherein the frequency tuning component is configured to operate the receiving coil at the first frequency when the MEMS switch is open and to operate the receiving coil at the second frequency when the MEMS switch is closed.

3. The system of claim 1, wherein the impedance matching component comprises a capacitance matching portion configured to provide either a first capacitance or a second capacitance to maintain the substantially constant impedance of the receiving coil.

4. The system of claim 3, wherein the capacitance matching portion comprises a MEMS switch coupled to a capacitor, wherein the capacitance matching portion is configured to provide the first capacitance when the MEMS switch is open and to provide the second capacitance when the MEMS switch is closed.

5. The system of claim 1, wherein the impedance matching component comprises an inductance matching portion configured to provide either a first inductance or a second inductance to adjust the impedance of the receiving coil.

6. The system of claim 5, wherein the inductance matching portion comprises a MEMS switch coupled to an inductor, wherein the inductance matching portion is configured to provide the first inductance when the MEMS switch is open and to provide the second inductance when the MEMS switch is closed.

7. The system of claim 1, comprising a MEMS switch configured to block the receiving coil from receiving signal when the MEMS switch is open, and wherein the MEMS switch is configured to open when a transmission coil is transmitting.

8. The system of claim 1, comprising a receiver coupled to the receiving coil via a first switch and a second switch, wherein the first and second switches are configured to electrically couple the receiving coil to the receiver via a first receiver chain or a second receiver chain, wherein the first receiver chain is configured to receive a signal from the receiving coil when the receiving coil is operated at the first frequency, and wherein the second receiver chain is configured to receive a signal from the receiving coil when the receiving coil is operated at the second frequency.

9. The system of claim 8, wherein the first or second receiver chain is configured to receive the signal from the receiving coil at the first or second, frequency, respectively, and to provide the signal to the receiver at a different frequency when selected via the first and second switches.

10. A multi-nuclear magnetic resonance imaging (MM) system, comprising:
an array of magnetic resonance (MR) receiving coils, wherein each of the receiving coils comprise:
a frequency tuning component configured to set the receiving coil to a first frequency to observe a first nucleus and to set the receiving coil to a second frequency to observe a second nucleus; and
an impedance matching component configured to match an impedance of the receiving coil at the second frequency to an impedance of the receiving coil at the first frequency; and
a receiver coupled to the array of receiving coils via one of a plurality of receiver chains.

11. The MRI system of claim 10, wherein the frequency tuning component comprises a first microelectromechanical system (MEMS) switch coupled to a first capacitor, wherein the first capacitor is configured to set the receiving coil to the second frequency when the first MEMS switch is closed.

12. The MRI system of claim 11, wherein the impedance matching component comprises a second MEMS switch coupled to a second capacitor and a third MEMS switch coupled to an inductor, wherein the second capacitor and the inductor are configured to match the impedance of the receiving coil at the second frequency to the impedance of the receiving coil at the first frequency.

13. The MRI system of claim 12, wherein the first or second MEMS switch has a switching time of 300 microseconds (µs) or less.

14. The MRI system of claim 12, wherein the first or second MEMS switch has a voltage rating of 400 volts (V) or more.

15. The MRI system of claim 12, wherein the first or second MEMS switch has an on-resistance of 1 ohm or less.

16. The MRI system of claim 12, wherein the first or second MEMS switch is designed to remain operational for at least $10^7$ switching cycles.

17. The MRI system of claim 10, comprising scanner control circuitry configured to control the frequency tuning component and the impedance matching component of each of the receiving coils of the MRI system.

18. The MRI system of claim 10, comprising system control circuitry configured to receive data from the receiver and to generate one or more MR images based, at least in part, on the received data.

19. A method, comprising:
operating a multi-nuclear magnetic resonance (MR) receiving coil at a first frequency to measure a first nucleus, wherein operating the receiving coil at the first frequency corresponds to a particular impedance;
switching a first switch of the receiving coil to change the frequency of the receiving coil from the first frequency to a second frequency;
switching a second switch of the receiving coil to alter a capacitance of the receiving coil; and
switching a third switch of the receiving coil to alter an inductance of the receiving coil; and
operating the receiving coil at the second frequency to measure a second nucleus, wherein switching the second and third switches substantially maintains the particular impedance of the receiving coil when the receiving coil is operated at the second frequency.

20. The method of claim 19, wherein the switching of the first, second, and third switches of the receiving coil occurs at substantially the same time.

21. The method of claim 19, wherein the first, second, and third switches comprise microelectromechanical system (MEMS) switches.

22. The method of claim 19, comprising switching a first receiver chain selection switch electrically coupled to the receiving coil, wherein the first receiver chain selector switch is configured to electrically couple the receiving coil to a particular one of a plurality of receiver chains.

23. The method of claim 22, comprising switching a second receiver chain selector switch electrically coupled to a receiver, wherein the second receiver chain selector switch is configured to electrically couple the receiver to the receiving coil via the particular one of a plurality of receiver chains selected by the first receiver chain selector switch.

24. The method of claim 23, wherein the first and second receiver chain selector switches are single pole double throw switches.

25. The method of claim 23, wherein the switching of the first and second selector switches and the switching of the first, second, and third switches of the receiving coil occur at substantially the same time.

26. The method of claim 19, wherein operating the multi-nuclear MR receiving coil at the first frequency comprises operating the receiving coil with the first switch of the receiving coil open, with the second switch of the receiving coil open, and with the third switch of the receiving coil closed.

27. The method of claim 26, wherein switching the first switch comprises switching the first switch of the receiving coil from open to closed, wherein switching the second switch comprises switching the second switch of the receiving coil from open to closed, and wherein switching the third switch comprises switching the third switch of the receiving coil from closed to open.

28. The method of claim 27, wherein switching the first switch of the receiving coil from open to closed comprises activating a first capacitor of the receiving coil, wherein switching the second switch of the receiving coil from open to closed comprises activating a second capacitor of the receiving coil, and wherein switching the third switch from closed to open comprises deactivating an inductor of the receiving coil.

29. The method of claim 19, wherein the first nucleus is hydrogen ($^{1}$H) and the second nucleus is carbon ($^{13}$C).

30. The method of claim 19, comprising receiving, via a processor of system control circuitry, data from a receiver chain operably coupled to the MR receiving coil; and generating one or more MR images based, at least in part, on the received data.

* * * * *